(12) United States Patent
Hsu et al.

(10) Patent No.: US 8,299,832 B1
(45) Date of Patent: Oct. 30, 2012

(54) ELECTRONIC OSCILLATION SIGNAL GENERATION CIRCUIT

(75) Inventors: Hsin-Chin Hsu, New Taipei (TW); Fang-Lih Lin, Taipei (TW)

(73) Assignee: AMICCOM Electronics Corporation, Hsinchu Science Park, Hsin-Chu (TW)

( * ) Notice: Subject to any disclaimer, the term of this patent is extended or adjusted under 35 U.S.C. 154(b) by 60 days.

(21) Appl. No.: 13/117,153

(22) Filed: May 27, 2011

(30) Foreign Application Priority Data

Apr. 19, 2011 (TW) ................................. 00113518 A

(51) Int. Cl.
*H03K 3/017* (2006.01)
(52) U.S. Cl. ..................... 327/171; 327/172; 323/283
(58) Field of Classification Search .......... 327/171–174, 327/291, 299; 323/282–283, 287
See application file for complete search history.

(56) References Cited

U.S. PATENT DOCUMENTS 8,080,986 B2 * 12/2011 Lai et al. ....................... 323/285

* cited by examiner

*Primary Examiner* — An Luu
(74) *Attorney, Agent, or Firm* — Winston Hsu; Scott Margo

(57) ABSTRACT

An electronic oscillation signal generation circuit includes an electronic oscillation circuit, a DC voltage source for providing a DC voltage to the electronic oscillation circuit, a switch for electrically connecting the electronic oscillation circuit to ground when the switch is turned on so as to generate an analog oscillation signal after the switch is turned off, a conversion circuit for converting the analog oscillation signal to a digital oscillation signal, a counter for generating a control signal when the digital oscillation signal reaches a predetermined number of periods, a delay unit for generating a delay signal a predetermined time after a falling edge of the digital oscillation signal is triggered, and a pulse signal generation circuit electrically connected to the counter and the delay unit for generating a pulse signal according to the control signal and the delay signal so as to turn on the switch.

8 Claims, 5 Drawing Sheets

ELECTRONIC OSCILLATION SIGNAL GENERATION CIRCUIT

BACKGROUND OF THE INVENTION

1. Field of the Invention

The present invention relates to an electronic oscillation signal generation circuit, and more particularly, to an electronic oscillation signal generation circuit utilizing a counter and a delay unit for maintaining amplitude and a period of an electronic oscillation signal.

2. Description of the Prior Art

Please refer to FIG. 1 and FIG. 2. FIG. 1 is a diagram showing an electronic oscillation signal generation circuit 100 of the prior art. FIG. 2 is a diagram showing related signals of the electronic oscillation signal generation circuit 100 of FIG. 1. The electronic oscillation signal generation circuit 100 of the prior art comprises an electronic oscillation circuit 110, a charging capacitor Cv, a switch T, a conversion circuit 120, a counter 130, a measurement unit 140, and a pulse signal generation circuit 150. The electronic oscillation circuit 110 comprises an inductor L and a capacitor C. The inductor L and the capacitor C are electrically connected to each other in parallel. The charging capacitor Cv is electrically connected to a first end of the electronic oscillation circuit 110 for providing a DC voltage to the electronic oscillation circuit 110. The switch T is for electrically connecting a second end of the electronic oscillation circuit 110 to ground G when the switch T is turned on, in order to allow electricity to flow to ground G from the charging capacitor Cv through the electronic oscillation circuit 110. When the switch T is turned off thereafter, the electronic oscillation circuit 110 generates an analog oscillation signal. The analog oscillation signal is generated from a trough position. The conversion circuit 120 is electrically connected to a second end of the electronic oscillation circuit 110 for converting the analog oscillation signal of the electronic oscillation circuit 110 to a digital oscillation signal.

However, amplitude of the analog oscillation signal decreases gradually due to resistance of the inductor L of the electronic oscillation circuit 110. In order to prevent the analog oscillation signal from over-decaying, the electronic oscillation signal generation circuit 100 of the prior art utilizes the counter 130, the measurement unit 140, and the pulse signal generation circuit 150 to turn on and turn off the switch T again when the analog oscillation signal reaches a predetermined number of periods, so as to generate a new analog oscillation signal. As shown in FIG. 1, the counter 130 is electrically connected to the conversion circuit 120 for counting the number of periods of the digital oscillation signals and generating a control signal when the digital oscillation signal reaches a predetermined number of periods. The measurement unit 140 is electrically connected to the electronic oscillation circuit 110 for measuring voltage level of the analog oscillation signal. The pulse signal generation circuit 150 is electrically connected to the counter 130 and the measurement unit 140. The pulse signal generation circuit 150 generates a pulse signal to turn on the switch T when the voltage level of the analog oscillation signal reaches a voltage level of the trough position after receiving the control signal of the counter 130. The switch T is turned off again immediately when the pulse signal disappears. Accordingly, the electronic oscillation circuit 110 generates a new analog oscillation signal in order to replace the old analog oscillation signal.

In the above arrangement, the measurement unit 140 needs to detect precisely when the analog oscillation signal reaches the trough, otherwise the new analog oscillation signal can not replace the old analog oscillation signal in the trough position (where an analog oscillation signal starts from), and the period of the digital oscillation signal is changed accordingly. However, the amplitude of the analog oscillation signal decreases gradually due to the resistance of the inductor L, that is, a peak value of the trough of the analog oscillation signal changes over time. Therefore, the electronic oscillation signal generation circuit 100 of the prior art can not precisely detect when the analog oscillation signal reaches the trough, and thus makes the period of the digital oscillation signal unstable. In addition, the measurement unit 140 needs to keep measuring the voltage level of the analog oscillation signal all the time, such that the electronic oscillation signal generation circuit 100 has more power consumption.

SUMMARY OF THE INVENTION

The present invention provides an electronic oscillation signal generation circuit comprising an electronic oscillation circuit, a DC voltage source electrically connected to a first end of the electronic oscillation circuit for providing a DC voltage to the electronic oscillation circuit, a switch for electrically connecting the electronic oscillation circuit to ground when the switch is turned on so as to generate an analog oscillation signal after the switch is turned off, a conversion circuit electrically connected to a second end of the electronic oscillation circuit for converting the analog oscillation signal to a digital oscillation signal, a counter electrically connected to the conversion circuit for generating a control signal when the digital oscillation signal reaches a predetermined number of periods, a delay unit for generating a delay signal a predetermined time after a falling edge of the digital oscillation signal is triggered, and a pulse signal generation circuit electrically connected to the counter and the delay unit for generating a pulse signal according to the control signal and the delay signal so as to turn on the switch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
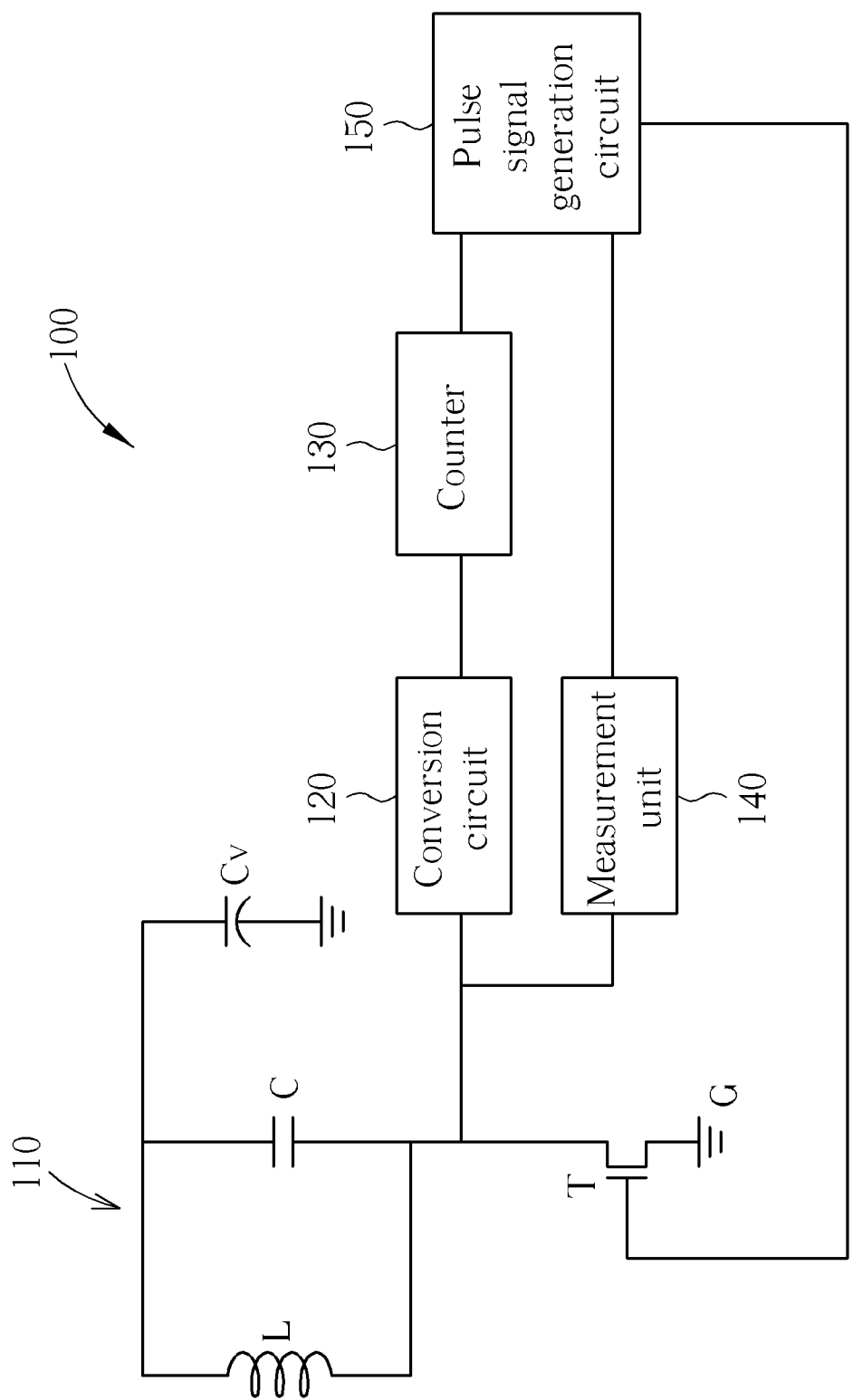
FIG. 1 is a diagram showing an electronic oscillation signal generation circuit of the prior art.
Figure 2:
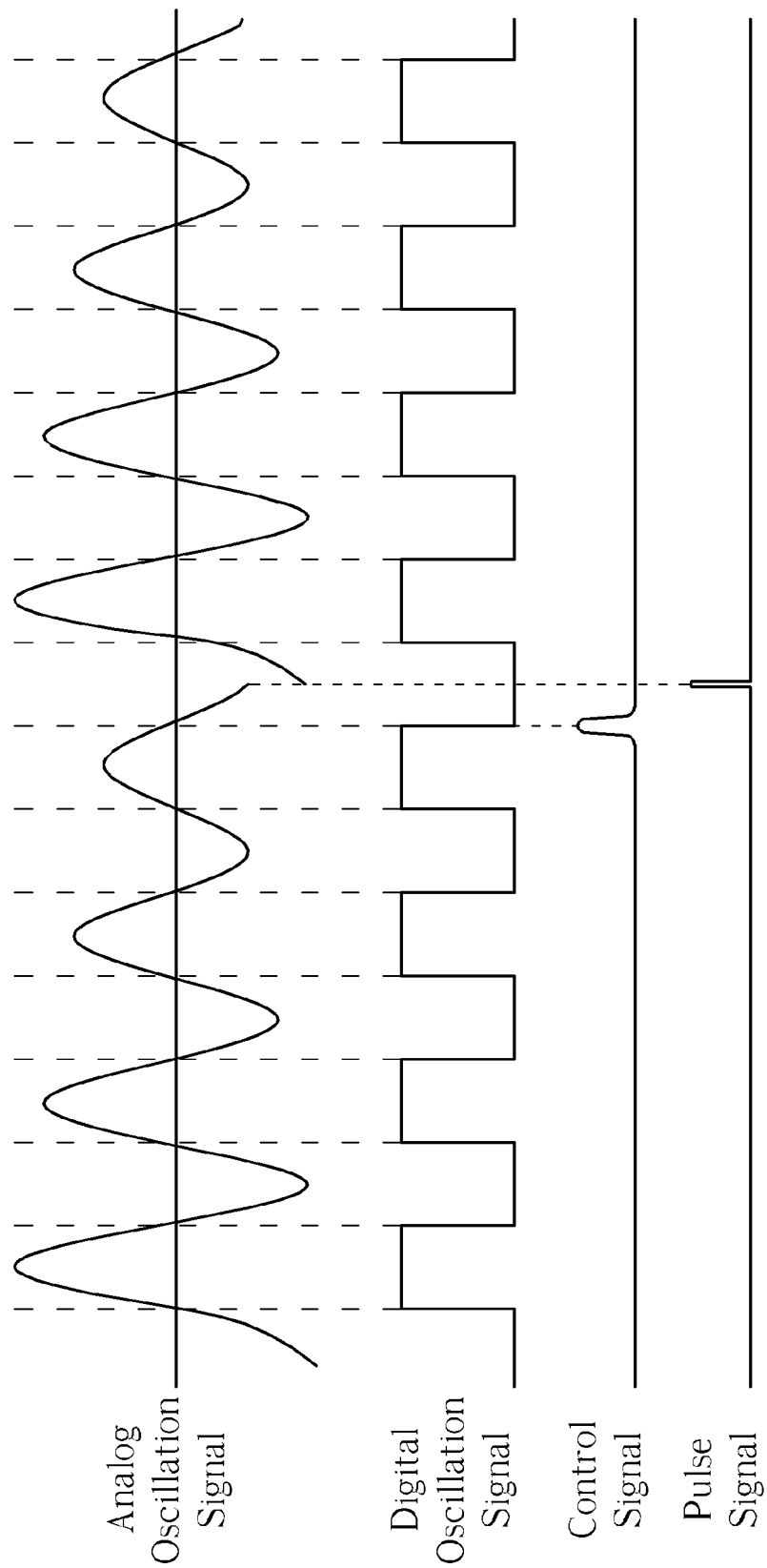
FIG. 2 is a diagram showing related signals of the electronic oscillation signal generation circuit of FIG. 1.
Figure 3:
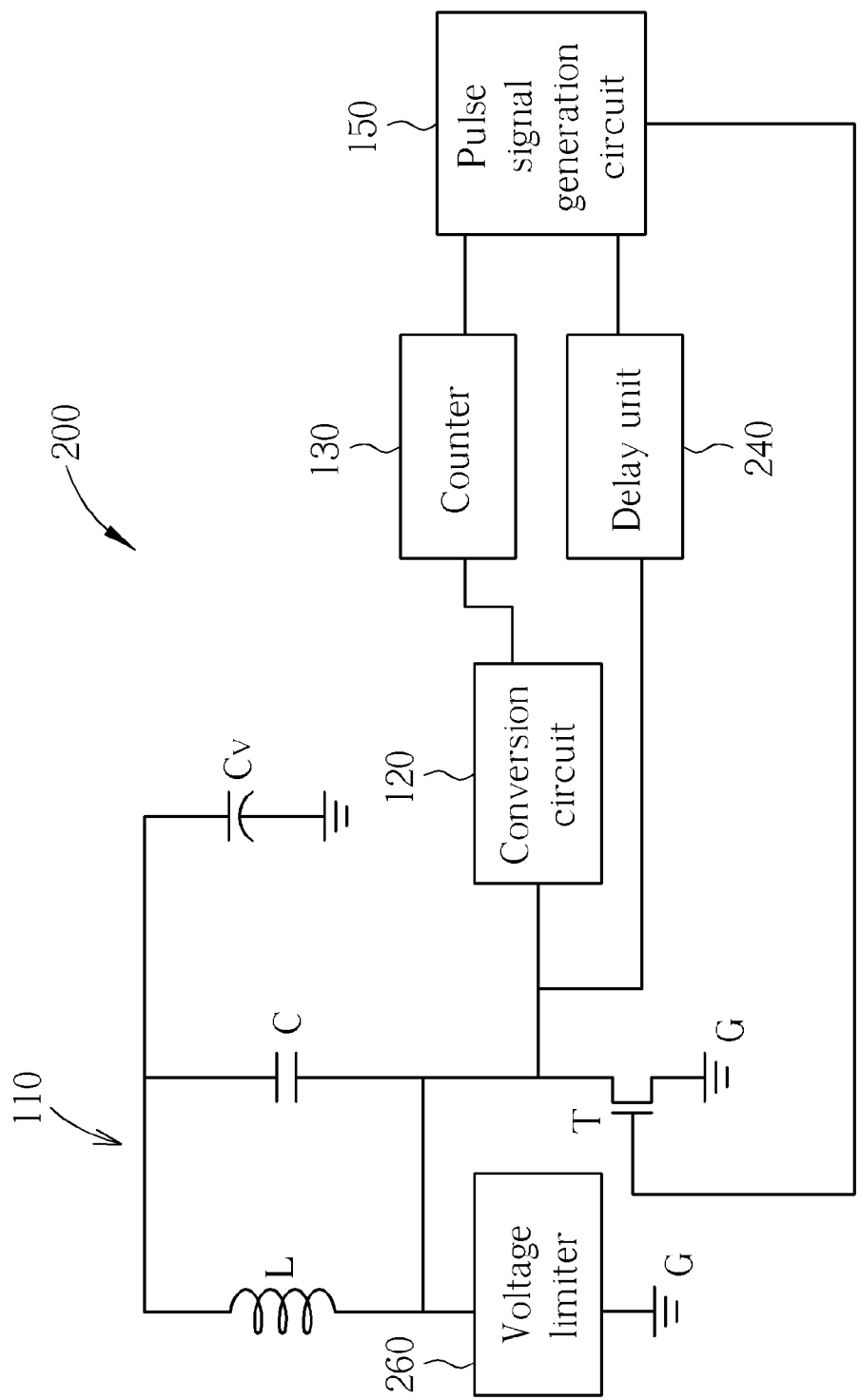
FIG. 3 is a diagram showing an electronic oscillation signal generation circuit of the present invention.

Please refer to FIG. 3. FIG. 3 is a diagram showing an electronic oscillation signal generation circuit 200 of the present invention. The electronic oscillation signal generation circuit 200 of the present invention comprises an electronic oscillation circuit 110, a charging capacitor Cv, a switch T, a conversion circuit 120, a counter 130, a delay unit 240, and a pulse signal generation circuit 150. The electronic oscillation circuit 110 comprises an inductor L and a capacitor C. The inductor L and the capacitor C are electrically connected to each other in parallel. The charging capacitor Cv is electrically connected to a first end of the electronic oscillation circuit 110 for providing a DC voltage to the electronic oscillation circuit 110. The switch T is for electrically connecting a second end of the electronic oscillation circuit 110 to ground G when the switch T is turned on, in order to allow electricity to flow to ground G from the charging capacitor Cv through the electronic oscillation circuit 110. When the switch T is turned off thereafter, the electronic oscillation circuit 110 generates an analog oscillation signal. The analog oscillation signal is generated from a trough position. The conversion circuit 120 is electrically connected to a second end of the electronic oscillation circuit 110 for converting the analog oscillation signal of the electronic oscillation circuit 110 to a digital oscillation signal.

Figure 4:
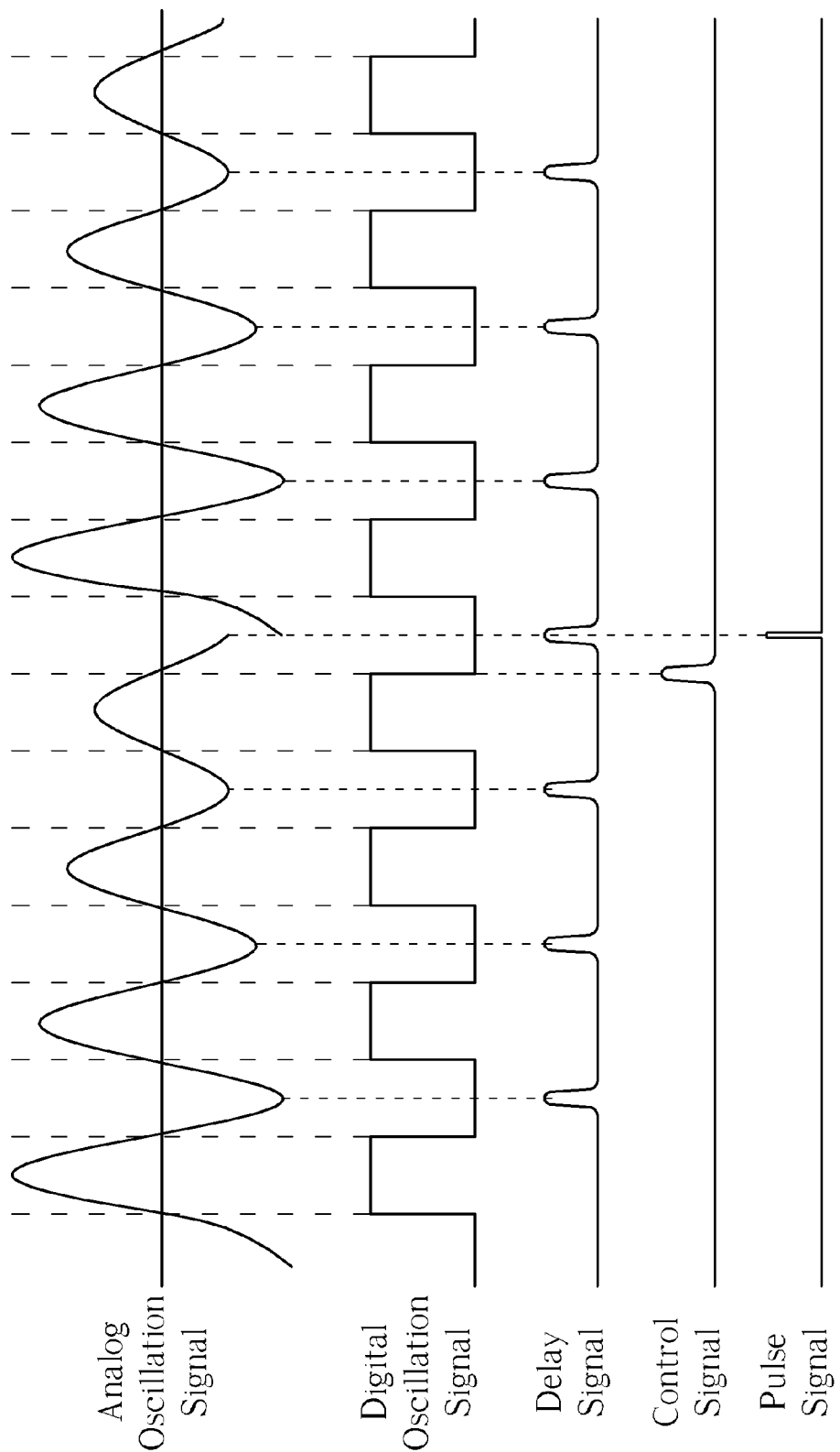
FIG. 4 is a diagram showing related signals of the electronic oscillation signal generation circuit of FIG. 3.

Different from the prior art, in order to prevent the analog oscillation signal from over-decaying, the electronic oscillation signal generation circuit 200 of the present invention utilizes the counter 130, the delay unit 240, and the pulse signal generation circuit 150 to turn on and turn off the switch T again when the analog oscillation signal reaches a predetermined number of periods, so as to generate a new analog oscillation signal. Please refer to FIG. 4 and refer to FIG. 3 as well. FIG. 4 is a diagram showing related signals of the electronic oscillation signal generation circuit 200 of FIG. 3. The counter 130 is electrically connected to the conversion circuit 120 for counting the number of periods of the digital oscillation signals and generating a control signal when the digital oscillation signal reaches a predetermined number of periods. The delay unit 240 is electrically connected to a second end of the electronic oscillation circuit 110 for generating a delay signal a predetermined time after a falling edge of the digital oscillation signal is triggered according to the analog oscillation signal. The pulse signal generation circuit 150 is electrically connected to the counter 130 and the delay unit 240. The pulse signal generation circuit 150 generates a pulse signal to turn on the switch T when receiving the delay signal of the delay unit 240 after receiving the control signal of the counter 130. The switch T is turned off again immediately when the pulse signal disappears. Accordingly, the electronic oscillation circuit 110 generates a new analog oscillation signal to replace the old analog oscillation signal.

Figure 5:
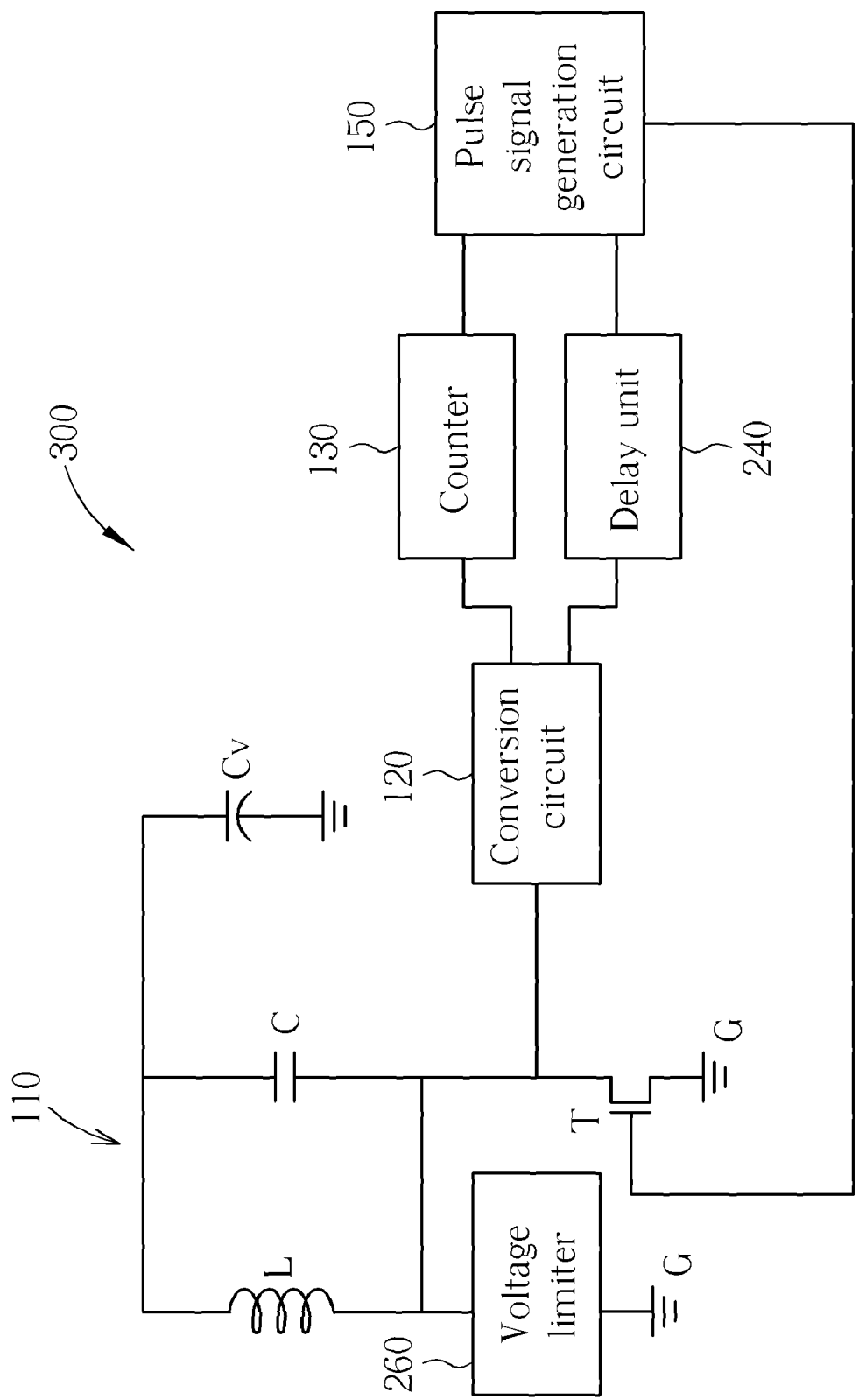
FIG. 5 is a diagram showing another electronic oscillation signal generation circuit of the present invention.

Please refer to FIG. 5. FIG. 5 is a diagram showing another electronic oscillation signal generation circuit 300 of the present invention. As shown in FIG. 5, the delay unit 240 can be electrically connected to the conversion circuit 120 for generating a delay signal the predetermined time after a falling edge of the digital oscillation signal is triggered according to the digital oscillation signal.

Since the period of the analog oscillation signal is constant, a time from the falling edge of the digital oscillation signal being triggered to the next trough of the analog oscillation signal being reached can be obtained in advance. The predetermined time of the delay unit 240 is the time from the falling edge of the digital oscillation signal being triggered to the next trough of the analog oscillation signal being reached. According to the above arrangement, the counter 130 generates a control signal when the digital oscillation signal reaches a predetermined number (for example, four) of periods of the falling edge. After that, the delay unit 240 generates a delay signal when a next trough of the analog oscillation signal is reached. The pulse signal generation circuit 150 generates a pulse signal to turn on the switch T when receiving the delay signal of the delay unit 240 after receiving the control signal of the counter 130. Therefore, a new analog oscillation signal can precisely replace the old analog oscillation signal in the trough position, such that the period of the digital oscillation signal is stable.

In addition, in the above embodiments, the electronic oscillation signal generation circuit 200, 300 utilizes a charging capacitor as a DC voltage source. The electronic oscillation signal generation circuit 200, 300 can also replace the charging capacitor with other components for providing DC voltage, such as a battery. The above electronic oscillation circuit 110 comprises an inductor and a capacitor electrically connected to each other in parallel. The electronic oscillation circuit can also be any combination of an inductor, a capacitor, and a resistance with other connection arrangement. The electronic oscillation signal generation circuit 200 can further comprise a voltage limiter 260 electrically connected to the second end of the electronic oscillation circuit 110, in order to prevent the components of the electronic oscillation signal generation circuit 200, 300 from being damaged by the peak voltage of the analog oscillation signal.

Furthermore, the electronic oscillation signal generation circuit 200, 300 can be an electronic oscillation signal generation circuit of a wireless transmission circuit (such as an active radio frequency identification device (RFID)). When power of the active RFID is running out, the charging capacitor can provide power to the electronic oscillation signal generation circuit to temporarily maintain operation of the electronic oscillation signal generation circuit, such that the active RFID can keep transmitting wireless signals according to the digital oscillation signal. The electronic oscillation signal generation circuit does not need to keep measuring the voltage level of the analog oscillation signal all the time, such that the electronic oscillation signal generation circuit of the present invention has longer operation time than the electronic oscillation signal generation circuit of the prior art.

In contrast to the prior art, the electronic oscillation signal generation circuit of the present invention can precisely maintain the period of the digital oscillation signal, and has better power consumption performance than the electronic oscillation signal generation circuit of the prior art.

Those skilled in the art will readily observe that numerous modifications and alterations of the device and method may be made while retaining the teachings of the invention.

What is claimed is:
1. An electronic oscillation signal generation circuit comprising:
   an electronic oscillation circuit;
   a DC voltage source electrically connected to a first end of the electronic oscillation circuit for providing a DC voltage to the electronic oscillation circuit;
   a switch for electrically connecting a second end of the electronic oscillation circuit to ground when the switch is turned on so as to generate an analog oscillation signal after the switch is turned off;
   a conversion circuit electrically connected to a second end of the electronic oscillation circuit for converting the analog oscillation signal to a digital oscillation signal;
   a counter electrically connected to the conversion circuit for generating a control signal when the digital oscillation signal reaches a predetermined number of periods;
   a delay unit for generating a delay signal a predetermined time after a falling edge of the digital oscillation signal is triggered; and
   a pulse signal generation circuit electrically connected to the counter and the delay unit for generating a pulse signal according to the control signal and the delay signal so as to turn on the switch.

2. The circuit of claim 1, wherein the electronic oscillation circuit comprises:
   an inductor; and
   a capacitor electrically connected to the inductor in parallel.

3. The circuit of claim 1, wherein the DC voltage source is a charging capacitor.

4. The circuit of claim 1, wherein the predetermined time is a time from the falling edge of the digital oscillation signal being triggered to a next trough of the analog oscillation signal being reached.

5. The circuit of claim 1 further comprising a voltage limiter electrically connected to the second end of the electronic oscillation circuit.

6. The circuit of claim 1 being an electronic oscillation signal generation circuit of a wireless transmission circuit.

7. The circuit of claim 1, wherein the delay unit is electrically connected to the second end of the electronic oscillation circuit.

8. The circuit of claim 1, wherein the delay unit is electrically connected to the conversion circuit.

* * * * *

UNITED STATES PATENT AND TRADEMARK OFFICE
CERTIFICATE OF CORRECTION

| | | |
|---|---|---|
| PATENT NO. | : 8,299,832 B1 | Page 1 of 1 |
| APPLICATION NO. | : 13/117153 | |
| DATED | : October 30, 2012 | |
| INVENTOR(S) | : Hsin-Chin Hsu et al. | |

It is certified that error appears in the above-identified patent and that said Letters Patent is hereby corrected as shown below:

On the title page, item (30), correct the application number of the Foreign Application Priority Data from "00113518" to --100113518--.

Signed and Sealed this
Fifteenth Day of January, 2013

David J. Kappos
*Director of the United States Patent and Trademark Office*